(12) United States Patent
Sun

(10) Patent No.: US 8,492,222 B2
(45) Date of Patent: Jul. 23, 2013

(54) METHOD FOR FORMING A PIXEL OF AN ORGANIC ELECTROLUMINESCENCE DEVICE HAVING STACKED STORAGE CAPACITORS CONNECTING BETWEEN POWER SUPPLY AND GATE ELECTRODE

(75) Inventor: Wein-Town Sun, Hsinchu (TW)

(73) Assignee: AU Optronics Corporation, Hsinchu (TW)

( * ) Notice: Subject to any disclaimer, the term of this patent is extended or adjusted under 35 U.S.C. 154(b) by 0 days.

(21) Appl. No.: 13/420,225

(22) Filed: Mar. 14, 2012

(65) Prior Publication Data

US 2012/0171787 A1 Jul. 5, 2012

Related U.S. Application Data

(62) Division of application No. 13/031,712, filed on Feb. 22, 2011, now Pat. No. 8,158,477, which is a division of application No. 11/616,943, filed on Dec. 28, 2006, now Pat. No. 7,915,117, which is a division of application No. 11/005,648, filed on Dec. 7, 2004, now Pat. No. 7,586,121.

(51) Int. Cl.
*H01L 21/8242* (2006.01)

(52) U.S. Cl.
USPC .................. 438/253; 438/155; 257/E21.411

(58) Field of Classification Search
USPC .................. 438/22, 29, 149, 155, 239, 253; 257/E21.411, E51.026
See application file for complete search history.

(56) References Cited

U.S. PATENT DOCUMENTS

| | | | |
|---|---|---|---|
| 5,459,596 A | 10/1995 | Ueda et al. | |
| 6,229,506 B1 * | 5/2001 | Dawson et al. | 345/82 |
| 6,320,204 B1 * | 11/2001 | Hirabayashi et al. | 257/71 |
| 6,610,997 B2 | 8/2003 | Murade | |
| 7,052,930 B2 * | 5/2006 | Park et al. | 438/66 |
| 7,196,746 B2 | 3/2007 | Yang | |
| 2002/0104995 A1 | 8/2002 | Yamazaki | |
| 2003/0052843 A1 * | 3/2003 | Yamazaki et al. | 345/82 |
| 2003/0067266 A1 * | 4/2003 | Kim et al. | 313/504 |
| 2003/0117059 A1 | 6/2003 | Koo et al. | |
| 2003/0127652 A1 | 7/2003 | Park et al. | |
| 2003/0186489 A1 * | 10/2003 | Ishikawa | 438/155 |

* cited by examiner

*Primary Examiner* — Anh Mai
(74) *Attorney, Agent, or Firm* — McClure, Qualey & Rodack, LLP

(57) ABSTRACT

A method is provided for forming a pixel of an electroluminescence device. The method provides a substrate; defines at least a first area for capacitors, a second area for a transistor on the substrate and a third area for an organic light-emitting diode (OLED) on the substrate; forms first conductive, first dielectric, second conductive, second dielectric, and third conductive layers over the first area; forming a third conductive layer over the second dielectric layer over the first area; wherein the first conductive layer over the first area is directly connected to a power supply voltage, wherein the second conductive layer is electrically connected to a fourth conductive layer and wherein the first conductive layer, the first dielectric layer, and the second conductive layer over the first area collectively form a first one of the capacitors over the first area, the second conductive layer, the second dielectric layer.

8 Claims, 11 Drawing Sheets

METHOD FOR FORMING A PIXEL OF AN ORGANIC ELECTROLUMINESCENCE DEVICE HAVING STACKED STORAGE CAPACITORS CONNECTING BETWEEN POWER SUPPLY AND GATE ELECTRODE

CROSS REFERENCE TO RELATED APPLICATIONS

This application is a divisional of U.S. patent application Ser. No. 13/031,712, filed Feb. 22, 2011, which is a divisional of U.S. patent application Ser. No. 11/616,943, filed Dec. 28, 2006 (now U.S. Pat. No. 7,915,117, issued on Mar. 29, 2011), which is a divisional of U.S. patent application Ser. No. 11/005,648, filed Dec. 7, 2004 (now U.S. Pat. No. 7,586,121, filed Sep. 8, 2009), the entirety of which is incorporated by reference herein.

BACKGROUND OF THE INVENTION

1. Field of the Invention

This invention relates in general to an electroluminescence device and, more particularly, to a storage capacitor of an electroluminescence device and a method for forming the storage capacitor.

2. Description of the Related Art

An electroluminescence ("EL") device is a device which makes use of the phenomenon of electroluminescence to emit light. An EL device generally includes thin film transistors ("TFTs") and light-emitting diodes ("LEDs"). Each LED further includes a light-emitting layer. If the light-emitting layer contains organic light-emitting material, the device is referred to as an organic EL device. When a current passes between a cathode and an anode of the LED device, light is emitted from the light-emitting layer.

Generally, an active matrix organic light emitting diode ("OLED") device or a polymer light emitting diode ("PLED") device, either voltage-driven or current-driven, includes an array of pixels, where each pixel comprises a set of sub-pixels. Each sub-pixel further includes a switching transistor, a driving transistor and a storage capacitor. If charging conditions permit, it is desirable to design a storage capacitor with a large capacitance in order to avoid an issue of gray scale fading due to crosstalk or feed-through effect. For bottom-emission pixels, a storage capacitor having a greater capacitance may disadvantageously result in a smaller aperture ratio. In OLED pixels, thin film transistors, scan lines, data lines and power lines included therein may further reduce the aspect ratio. It is thus desirable to have a storage capacitor that includes improved capacitance in a limited area.

BRIEF SUMMARY OF INVENTION

Consistent with embodiments of the present invention, there is provided a method for forming a pixel of an electroluminescence device that includes providing a substrate; defining at least a first area for capacitors and a second area for a transistor on the substrate; forming a first conductive layer over the first area; forming a first dielectric layer over the first conductive layer over the first area; forming a second conductive layer over the first dielectric layer over the first area; forming a second dielectric layer over the second conductive layer over the first area; forming a third conductive layer over the second dielectric layer over the first area; forming a layer of capping silicon nitride between the second dielectric layer and the third conductive layer over the first area; forming a semiconductor layer over the second area; forming a gate oxide layer over the second area; and forming a fourth conductive layer over the gate oxide layer over the second area; wherein the first conductive layer over the first area is connectable to a power supply voltage, and wherein the first conductive layer, the first dielectric layer, and the second conductive layer over the first area collectively form a first one of the capacitors over the first area, the second conductive layer, the second dielectric layer, and the third conductive layer over the first area collectively form a second one of the capacitors over the first area, and the semiconductor layer, the gate oxide layer, and the fourth conductive layer over the second area collectively form a transistor.

Consistent with embodiments of the present invention, there is also provided a method for forming a pixel of an electroluminescence device that includes providing a substrate; defining at least a first area for capacitors, a second area for a transistor on the substrate and a third area for an organic light-emitting diode (OLED) on the substrate; forming a first conductive layer over the first area; forming a first dielectric layer over the first conductive layer over the first area; forming a second conductive layer over the first dielectric layer over the first area; forming a second dielectric layer over the second conductive layer over the first area; forming a third conductive layer over the second dielectric layer over the first area; forming a semiconductor layer over the second area; forming a gate oxide layer over the second area; forming a fourth conductive layer over the gate oxide layer over the second area; forming the gate oxide over the first area; forming the first conductive layer over the gate oxide, wherein forming the first conductive layer and forming the fourth conductive layer comprise forming the first conductive layer and the fourth conductive layer using the same material, wherein forming the first dielectric layer comprises forming a layer of interlayer dielectric (ILD), and wherein forming the second dielectric layer comprises forming a layer of passivation silicon nitride; forming a fifth conductive layer over the third area; and forming an organic layer over the fifth conductive layer over the third area, wherein the third conductive layer is over the organic layer over the third area, and wherein the fifth conductive layer, the organic layer, and the third conductive layer over the third area collectively form the OLED, wherein the first conductive layer over the first area is connectable to a power supply voltage, and wherein the first conductive layer, the first dielectric layer, and the second conductive layer over the first area collectively form a first one of the capacitors over the first area, the second conductive layer, the second dielectric layer, and the third conductive layer over the first area collectively form a second one of the capacitors over the first area, and the semiconductor layer, the gate oxide layer, and the fourth conductive layer over the second area collectively form a transistor, and wherein forming the second conductive layer and forming the fifth conductive layer comprise forming the second conductive layer and the fifth conductive layer using the same material.

Consistent with embodiments of the present invention, there is also provided a method for forming a pixel of an electroluminescence device that includes providing a substrate; defining at least a first area for capacitors, a second area for a transistor on the substrate and a third area for an organic light-emitting diode (OLED) on the substrate; forming a first conductive layer over the first area; forming a first dielectric layer over the first conductive layer over the first area; forming a second conductive layer over the first dielectric layer over the first area; forming a second dielectric layer over the second conductive layer over the first area; forming a third conductive layer over the second dielectric layer over the first area; forming a layer of capping silicon nitride between the second dielectric layer and the third conductive layer over the first area; forming a semiconductor layer over the second area; forming a gate oxide layer over the first area and the second area, wherein the first conductive layer is both over the gate oxide over the first area and over the second area, the first conductive layer providing contact to the semiconductor layer over the second area; forming a fourth conductive layer over the gate oxide layer over the second area; forming a fifth conductive layer over the third area; and forming an organic layer over the fifth conductive layer over the third area, wherein the third conductive layer over the organic layer over the third area, wherein the first conductive layer over the first area is connectable to a power supply voltage, and wherein the first conductive layer, the first dielectric layer, and the second conductive layer over the first area collectively form a first one of the capacitors over the first area, the second conductive layer, the second dielectric layer, and the third conductive layer over the first area collectively form a second one of the capacitors over the first area, and the semiconductor layer, the gate oxide layer, and the fourth conductive layer over the second area collectively form a transistor, and wherein forming the first dielectric layer comprises forming a layer of passivation silicon nitride, forming the second conductive layer and forming the fifth conductive layer comprise forming the second conductive layer and the fifth conductive layer using the same material, and forming the second dielectric layer comprises forming a layer of capping silicon nitride, and wherein the fifth conductive layer, the organic layer, and the third conductive layer over the third area collectively form the OLED.

Consistent with embodiments of the present invention, there is also provided a method for forming a pixel of an electroluminescence device that includes providing a substrate; defining at least a first area for capacitors, a second area for a transistor on the substrate and a third area for an organic light-emitting diode (OLED) on the substrate; forming a first conductive layer over the first area; forming a first dielectric layer over the first conductive layer over the first area; forming a second conductive layer over the first dielectric layer over the first area; forming a second dielectric layer over the second conductive layer over the first area; forming a third conductive layer over the second dielectric layer over the first area; forming a semiconductor layer over the second area; forming a gate oxide layer over the second area and over the first conductive layer over the first area, wherein forming the first dielectric layer comprises forming an interlayer dielectric over the gate oxide; and forming a fourth conductive layer over the gate oxide layer over the second area; forming a fifth conductive layer over the third area; forming an organic layer over the fifth conductive layer over the third area, wherein forming the second dielectric layer comprises forming the organic layer over the second conductive layer, wherein the third conductive layer is over the organic layer over the third area; wherein the first conductive layer over the first area is connectable to a power supply voltage, and wherein the first conductive layer, the first dielectric layer, and the second conductive layer over the first area collectively form a first one of the capacitors over the first area, the second conductive layer, the second dielectric layer, and the third conductive layer over the first area collectively form a second one of the capacitors over the first area, and the semiconductor layer, the gate oxide layer, and the fourth conductive layer over the second area collectively form a transistor, and wherein forming the first conductive layer and forming the semiconductor layer comprise forming the first conductive layer and the semiconductor layer using the same semiconductor material which is provided as doped polysilicon, and wherein the fifth conductive layer, the organic layer, and the third conductive layer over the third area collectively form the OLED.

Additional features and advantages of the invention will be set forth in part in the description which follows, and in part will be obvious from the description, or may be learned by practice of the invention. The features and advantages of the invention will be realized and attained by means of the elements and combinations particularly pointed out in the appended claims.

It is to be understood that both the foregoing general description and the following detailed description are exemplary and explanatory only and are not restrictive of the invention, as claimed

BRIEF DESCRIPTION OF DRAWINGS

The invention can be more fully understood by reading the subsequent detailed description and examples with references made to the accompanying drawings, wherein.

DETAILED DESCRIPTION OF INVENTION

Reference will now be made in detail to embodiments of the present invention, examples of which are illustrated in the accompanying drawings. Wherever possible, the same reference numbers will be used throughout the drawings to refer to the same or like parts.

Figure 1:
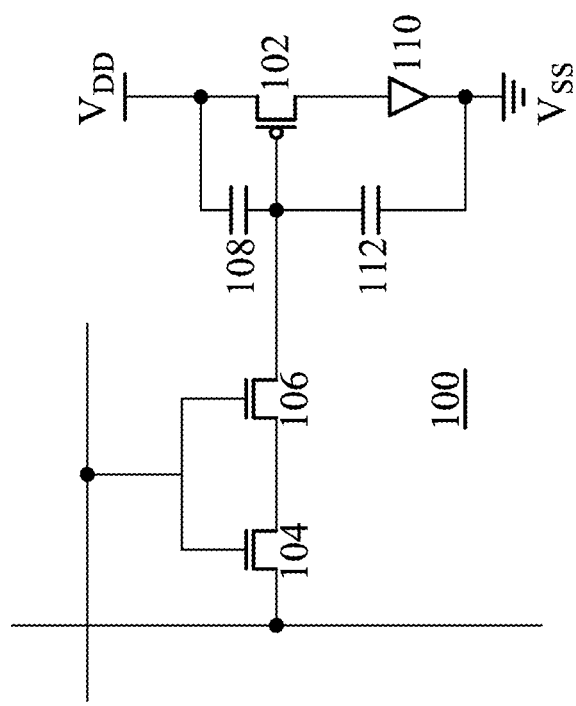
FIG. 1 is a circuit diagram of a pixel of an electroluminescence device consistent with embodiments of the present invention.

An electroluminescence (EL) device may include an array of pixels formed on a substrate such as glass and FIG. 1 shows a circuit diagram of an exemplary pixel 100 consistent with embodiments of the present invention. Pixel 100 includes three MOS transistors 102, 104, and 106, a capacitor 108, and an OLED 110. In one aspect, transistor 102 is a p-type MOS transistor and transistors 104 and 106 are n-type MOS transistors. Each of transistors 102, 104, and 106 has a gate (not numbered), a source (not numbered), and a drain (not numbered). It is to be understood that an MOS structure is generally symmetrical and therefore the source and drain of the MOS transistors in the descriptions herein and in the following may be interchanged without affecting the functions thereof or the scope of the present invention.

The gate of transistor 102 is coupled to the source of transistor 106. The source of transistor 102 is coupled to a power supply voltage $V_{DD}$. The drain of transistor 102 is coupled to drive OLED 110. The gates of both transistors 104 and 106 are coupled to a scan line, the drain of transistor 106 is coupled to the source of transistor 104, and the drain of transistor 104 is coupled to a data line to receive data. Capacitor 108 is coupled between the gate and source of transistor 102. OLED 110 has an anode coupled to the drain of transistor 102 and a cathode coupled to a power supply voltage $V_{SS}$. In one aspect, $V_{SS}$ is ground. In operation, capacitor 108 holds a charge when transistors 104 and 106 are turned off, to maintain a voltage between the gate and source of transistor 102 for driving OLED 110.

Pixel 100 further includes a capacitor 112 coupled between the gate of transistor 102 and the cathode of OLED 110. Thus, both capacitors 108 and 112 store charge when transistors 104 and 106 are turned off, to maintain the gate voltage of transistor 102. In this sense, capacitors 108 and 112 are coupled to each other in parallel and may be collectively viewed as a storage capacitor of pixel 100 whose capacitance is equal to the sum of the capacitances of both capacitors 108 and 112.

In one aspect, capacitor 112 is physically formed over the same area of a substrate where capacitor 108 is formed. Therefore, the storage capacitance of pixel 100 is increased without a chip area thereof being increased. In another aspect, capacitor 112 is formed at the same time OLED 110 and other parts of pixel 100 are formed, without requiring additional masks.

Figure 2:
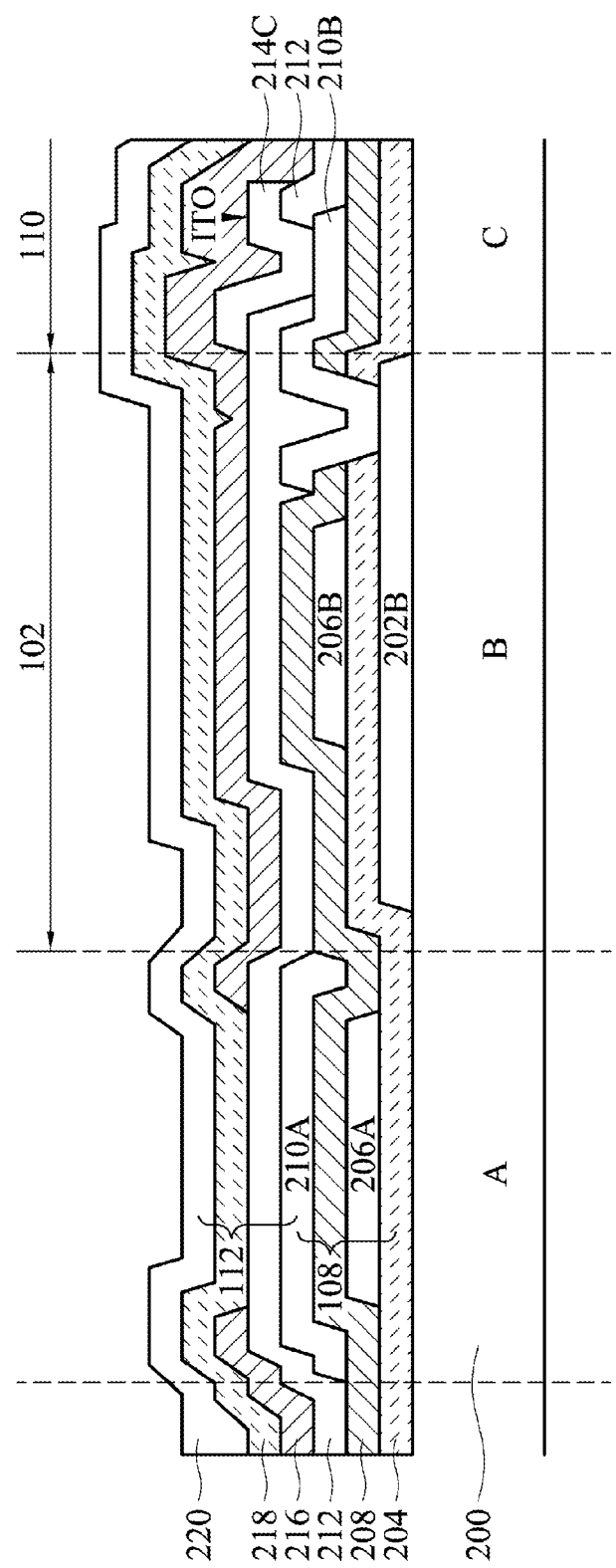
FIG. 2 is a cross-sectional view of a part of the pixel of FIG. 1 and consistent with a first embodiment of the present invention.

FIG. 2 shows a cross-sectional view of part of pixel 100 consistent with a first embodiment of the present invention. Only a portion of OLED 110, a portion of transistor 102, and capacitors 108 and 112 are shown. To simplify illustration, transistors 104 and 106 are not shown in FIG. 2.

Referring to FIG. 2, pixel 100 is formed on a glass substrate 200. Capacitors 108 and 112 are shown to be formed over an area A of substrate 200, transistor 102 is shown to be formed over an area B of substrate 200, and part of OLED 110 is shown to be formed in an area C of substrate 200.

Referring to FIG. 2, a layer of polysilicon is doped and patterned to form a doped polysilicon 202B and intrinsic polysilicon 202 over area B of substrate 200. A layer of gate oxide 204 is formed over all of areas A, B, and C. A layer of first metal is deposited over gate oxide 204 and patterned to form first metal patterns 206A and 206B over areas A and B, respectively. A layer of interlayer dielectric (ILD) 208 is formed over first metal patterns 206A and 206B. A layer of second metal is deposited over ILD 208 and patterned to form second metal patterns 210A over area A and 210B over both areas B and C, wherein second metal pattern 210B contacts polysilicon pattern 202B through a via hole (not numbered) in ILD 208 and gate oxide 204. A layer of passivation silicon nitride (SiN) 212 is formed over ILD 208 and second metal patterns 210A and 210B. A layer of indium tin oxide (ITO) is formed over passivation SiN 212 and patterned to form an ITO pattern 214C over area C of substrate 200, wherein ITO pattern 214C contacts second metal pattern 210B through a via hole (not numbered) in passivation SiN 212. A layer of capping SiN 216 is deposited to cover passivation SiN 212 and ITO pattern 214C. A layer of organics 218 is deposited over all of areas A, B, and C. Over area A, capping SiN 216 is also patterned to expose a portion of passivation SiN 212. Thus, organic 218 is also formed on passivation SiN 212 over area A. A layer of third metal 220 is formed over organic 218.

Over area A, first metal pattern 206A, ILD 208, and second metal pattern 210A collectively form capacitor 108; and second metal pattern 210A, passivation SiN 212, organic 218, and third metal 220 collectively form capacitor 112(更正). Over area B, polysilicon pattern 202B provides the source and drain of transistor 102 and first metal pattern 206B serves as the gate of transistor 102. Over area C, ITO pattern 214C, capping SiN 216, organic 218, and third metal 220 collectively form part of OLED 110. Also, first metal pattern 206A is coupled to power supply voltage $V_{DD}$, second metal pattern 210A is coupled to the gate of transistor 102, i.e., first metal pattern 206B, and third metal 220 is coupled to $V_{SS}$.

As shown in FIG. 2, capacitors 108 and 112 are formed over the same area (area A) of substrate 200. Therefore, the storage capacitance of pixel 100 is increased without increasing the area of the storage capacitor and, consequently, without decreasing an aperture ratio. Also, one skilled in the art should now appreciate that no additional masks are required to form capacitors 108 and 112. For example, first metal pattern 206A may be formed using an existing mask that is required for forming first metal pattern 206B and second metal pattern 210A may be formed using an existing mask that is required for forming second metal pattern 210B.

In FIG. 2, ITO pattern 214C is formed over second metal pattern 210B. However, the layer of ITO may also be deposited and patterned prior to the deposition of the second metal and the formation of second metal patterns 210A and 210B. Similarly, passivation SiN 212 may also be deposited prior to the deposition of the second metal and the formation of second metal patterns 210A and 210B.

It is to be understood that the configuration of pixel 100 as shown in FIGS. 1 and 2 is exemplary only. The present invention may be applied to any suitable EL device. For example, a pixel consistent with an aspect of the present invention may include a plurality of capacitors such as capacitors 108 and 112 formed over the same area of a substrate and one or more transistors, but may include no OLED.

Further, in FIG. 2, capacitor 108 comprises first metal pattern 206A, ILD 208, and second metal pattern 210A, and capacitor 112 comprises second metal pattern 210A, passivation SiN 212, organic 218, and third metal 220. However, it is to be understood that other layers of materials required for forming pixel 100 may also be used to form capacitors 108 and 112.

Figure 3:
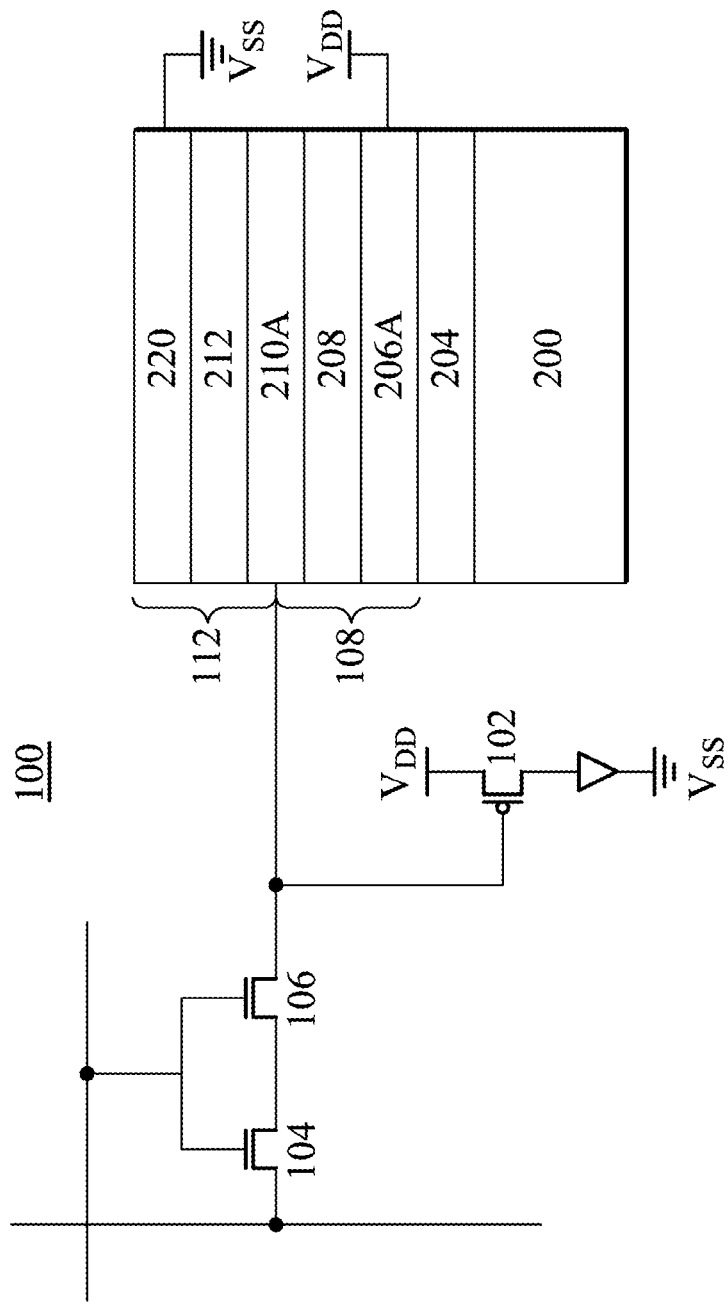
FIG. 3 is a circuit diagram of a pixel of an electroluminescence device consistent with a second embodiment of the present invention.

For example, consistent with a second embodiment of the present invention, organic 218 may be removed from area A, as shown in FIG. 3, which shows a circuit diagram of pixel 100 and a cross-sectional view of capacitors 108 and 112 consistent with the second embodiment of the present invention. Thus, capacitor 112 comprises second metal pattern 210A, passivation silicon nitride 212, and third metal 220, while capacitor 108 comprises first metal pattern 206A, ILD 208, and second metal pattern 210A. Also, first metal pattern 206A is coupled to power supply voltage $V_{DD}$, second metal pattern 210A is coupled to the gate of transistor 102, i.e., first metal pattern 206B, and third metal 220 is coupled to $V_{SS}$.

Figure 4:
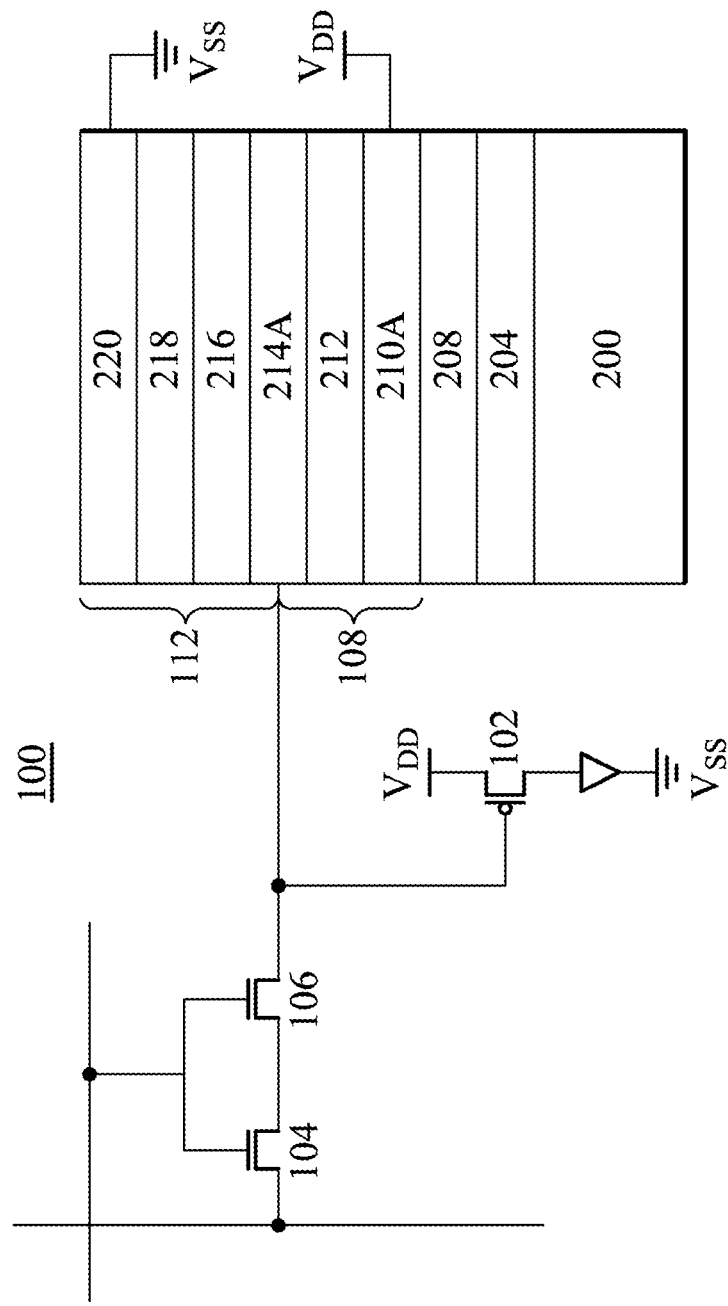
FIG. 4 is a circuit diagram of a pixel of an electroluminescence device consistent with a third embodiment of the present invention.

As shown in FIG. 4, which shows a circuit diagram of pixel 100 and a cross-sectional view of capacitors 108 and 112 consistent with a third embodiment of the present invention, both capping SiN 216 and organic 218 may be formed over area A and the layer of ITO may be patterned to form an ITO pattern 214A over area A, while first metal pattern 206A is not formed during the deposition and patterning of the layer of first metal. Thus, capacitor 108 comprises second metal pattern 210A, passivation SiN 212, and ITO pattern 214A; and capacitor 112 comprises ITO pattern 214A, capping SiN 216, organic 218, and third metal 220. Also, second metal pattern 210A is coupled to power supply voltage $V_{DD}$, ITO pattern 214A is coupled to the gate of transistor 102, i.e., first metal pattern 206B, and third metal 220 is coupled to $V_{SS}$.

Figure 5:
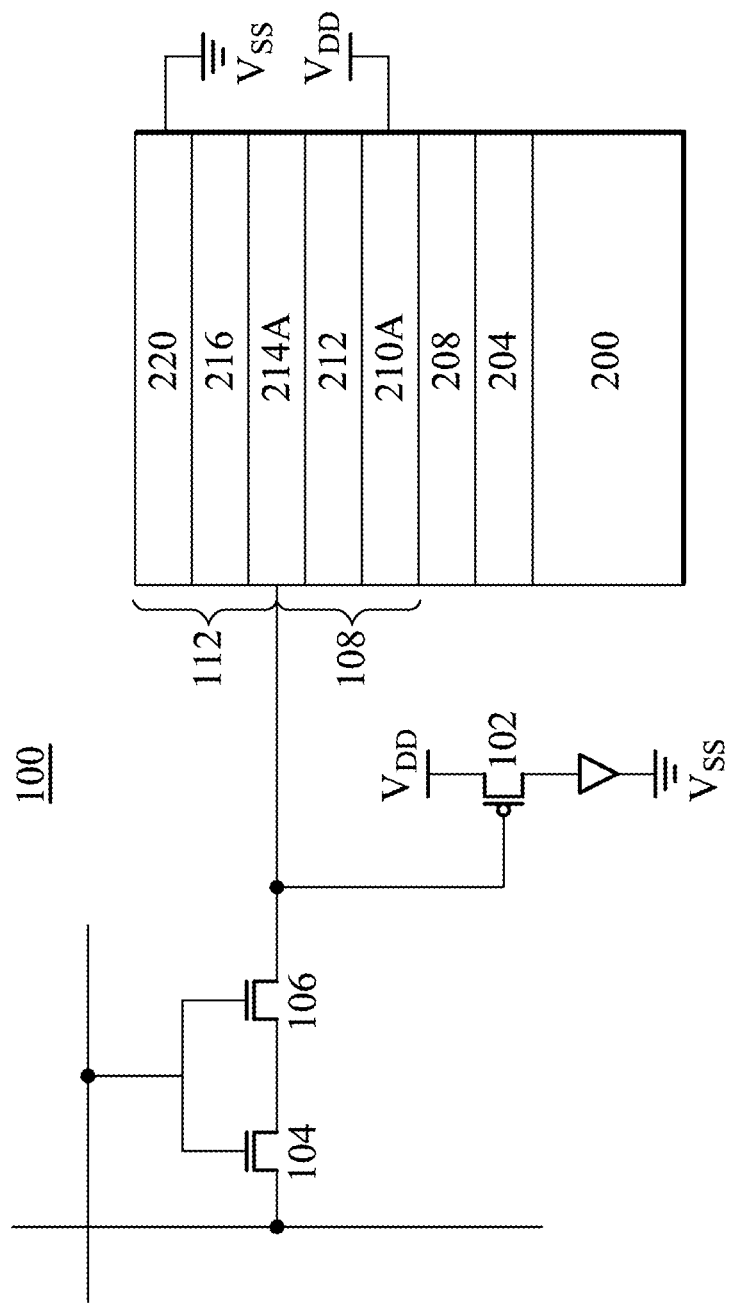
FIG. 5 is a circuit diagram of a pixel of an electroluminescence device consistent with a fourth embodiment of the present invention.

FIG. 5 shows a circuit diagram of pixel 100 and a cross-sectional view of capacitors 108 and 112 consistent with a fourth embodiment of the present invention. As shown in FIG. 5, capacitor 108 comprises second metal pattern 210A, passivation silicon nitride 212, and ITO pattern 214A; and capacitor 112 comprises ITO pattern 214A, capping SiN 216, and third metal layer 220. Also, second metal pattern 210A is coupled to power supply voltage $V_{DD}$, ITO pattern 214A is coupled to the gate of transistor 102, i.e., first metal pattern 206B, and third metal 220 is coupled to $V_{SS}$.

Figure 6:
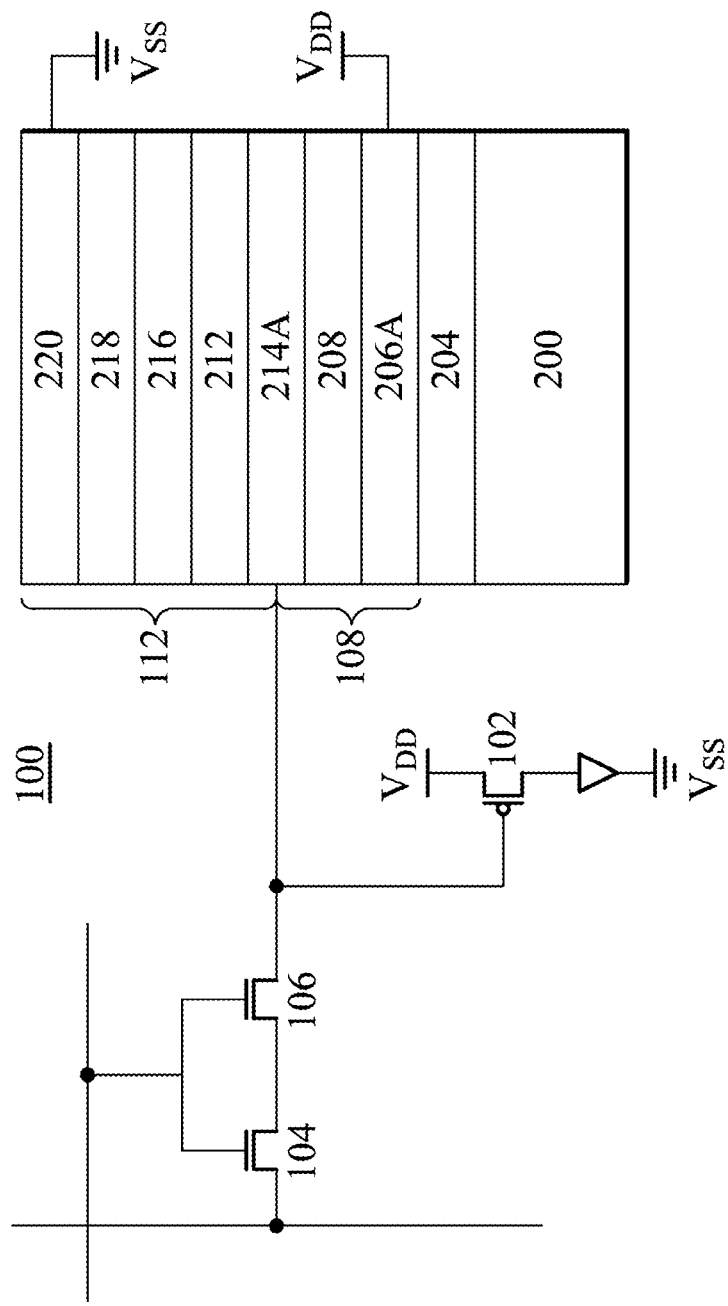
FIG. 6 is a circuit diagram of a pixel of an electroluminescence device consistent with a fifth embodiment of the present invention.

FIG. 6 shows a circuit diagram of pixel 100 and a cross-sectional view of capacitors 108 and 112 consistent with a fifth embodiment of the present invention, wherein the layer of ITO is deposited prior to the deposition of the layer of second metal. As shown in FIG. 6, capacitor 108 comprises first metal pattern 206A, ILD 208, and ITO pattern 214A; and capacitor 112 comprises ITO pattern 214A, passivation silicon nitride 212, capping silicon nitride 216, organic 218, and third metal layer 220. Also, first metal pattern 206A is coupled to power supply voltage $V_{DD}$, ITO pattern 214A is coupled to the gate of transistor 102, i.e., first metal pattern 206B, and third metal 220 is coupled to $V_{SS}$.

Figure 7:
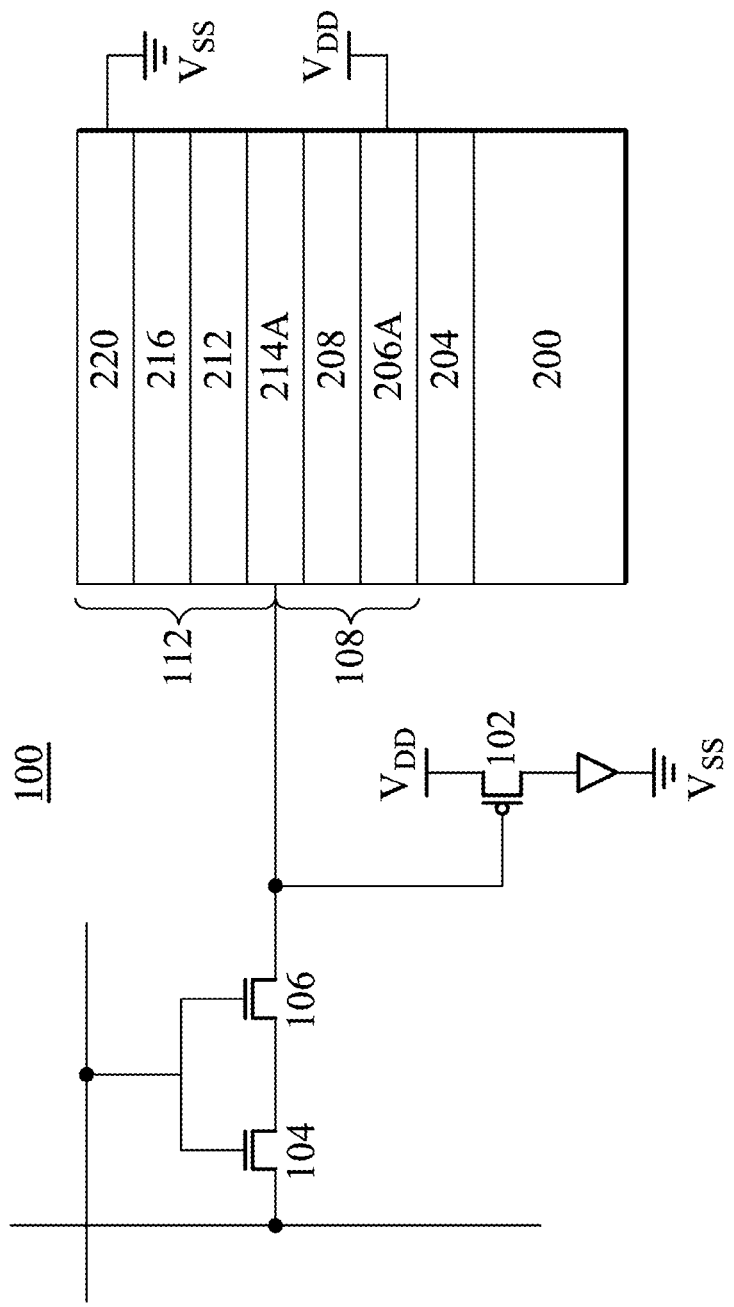
FIG. 7 is a circuit diagram of a pixel of an electroluminescence device consistent with a sixth embodiment of the present invention.

FIG. 7 shows a circuit diagram of pixel 100 and a cross-sectional view of capacitors 108 and 112 consistent with a sixth embodiment of the present invention, wherein the layer of ITO is deposited prior to the deposition of the layer of second metal. As shown in FIG. 7, capacitor 108 comprises first metal 206A, ILD 208, and ITO pattern 214A; and capacitor 112 comprises ITO pattern 214A, passivation silicon nitride 212, capping silicon nitride 216, and third metal layer 220. Also, first metal pattern 206A is coupled to power supply voltage $V_{DD}$, ITO pattern 214A is coupled to the gate of transistor 102, i.e., first metal pattern 206B, and third metal 220 is coupled to $V_{SS}$.

Figure 8:
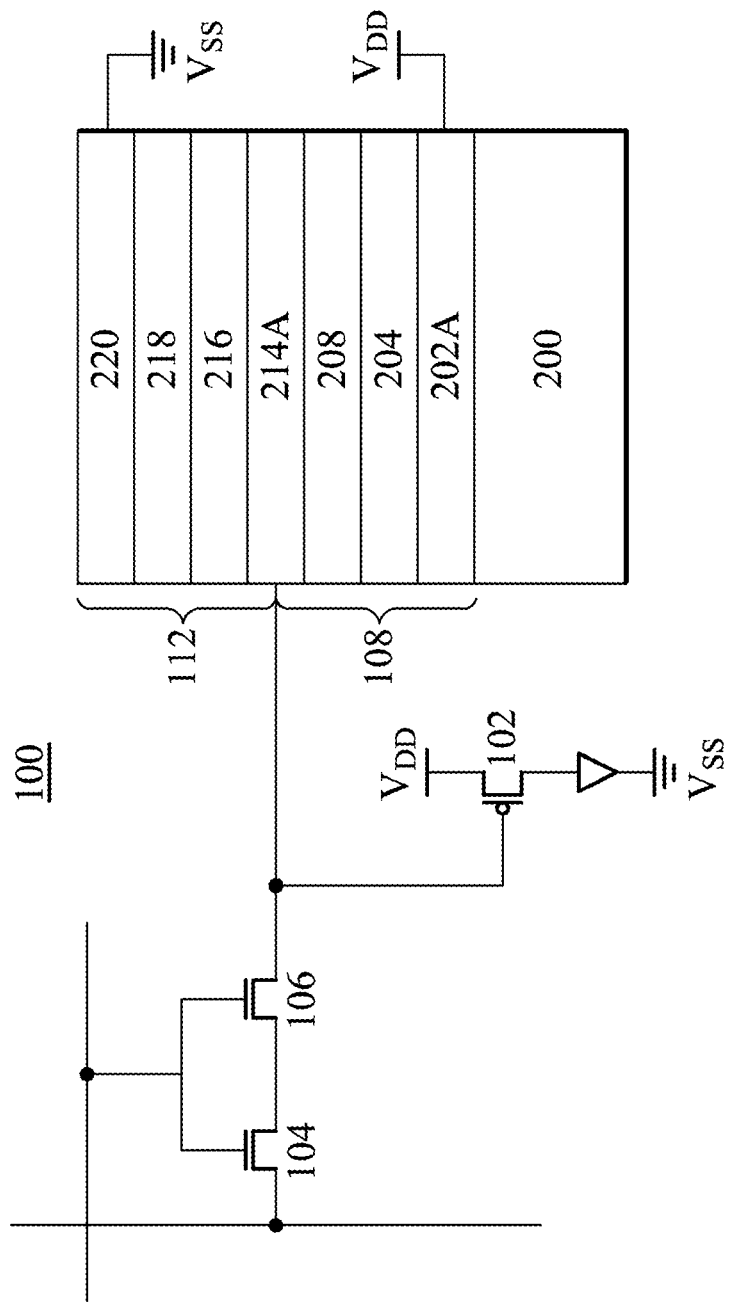
FIG. 8 is a circuit diagram of a pixel of an electroluminescence device consistent with a seventh embodiment of the present invention.

FIG. 8 shows a circuit diagram of pixel 100 and a cross-sectional view of capacitors 108 and 112 consistent with a seventh embodiment of the present invention. As shown in FIG. 8, the layer of doped polysilicon is also patterned to form a polysilicon pattern 202A over area A of substrate 200. Thus, capacitor 108 comprises polysilicon pattern 202A, oxide 204, ILD 208, and ITO pattern 214A; and capacitor 112 comprises ITO pattern 214A, capping silicon nitride 216, organic 218, and third metal layer 220. Also, polysilicon pattern 202A is coupled to power supply voltage $V_{DD}$, ITO pattern 214A is coupled to the gate of transistor 102, i.e., first metal pattern 206B, and third metal 220 is coupled to $V_{SS}$.

Figure 9:
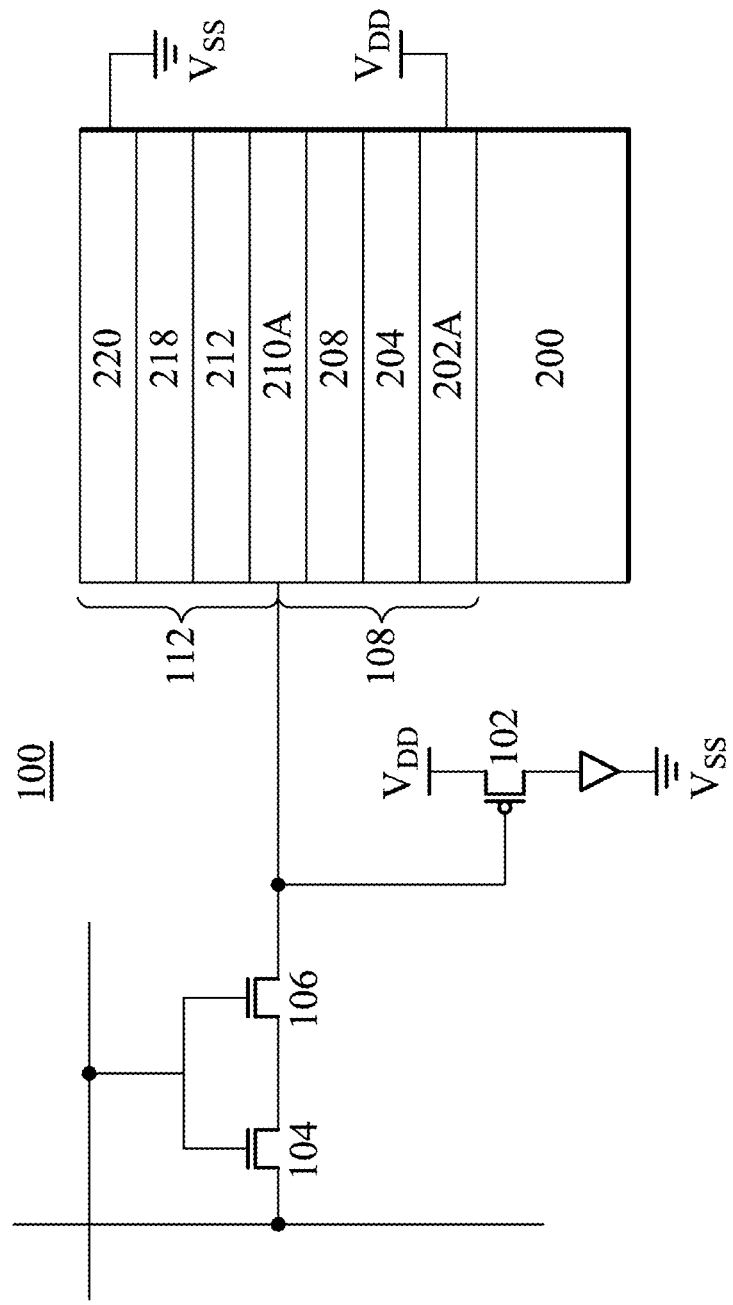
FIG. 9 is a circuit diagram of a pixel of an electroluminescence device consistent with an eighth embodiment of the present invention.

Further, FIG. 9 shows a circuit diagram of pixel 100 and a cross-sectional view of capacitors 108 and 112 consistent with an eighth embodiment of the present invention. As shown in FIG. 9, capacitor 108 comprises doped polysilicon pattern 202A, oxide 204, ILD 208, and second metal pattern 210A; and capacitor 112 comprises second metal pattern 210A, passivation silicon nitride 212, organic 218, and third metal layer 220. Polysilicon pattern 202A is coupled to power supply voltage $V_{DD}$, second metal pattern 210A is coupled to the gate of transistor 102, i.e., first metal pattern 206B, and third metal 220 is coupled to $V_{SS}$.

In FIGS. 3-9, both the cross-sectional views of capacitors 108 and 112 and the circuit diagram of pixel 100 are shown and only the structures of capacitors 108 and 112 are discussed in the above. The rest of the circuit of pixel 100 was previously described with reference to FIG. 1 and is not further described herein.

Figure 10:
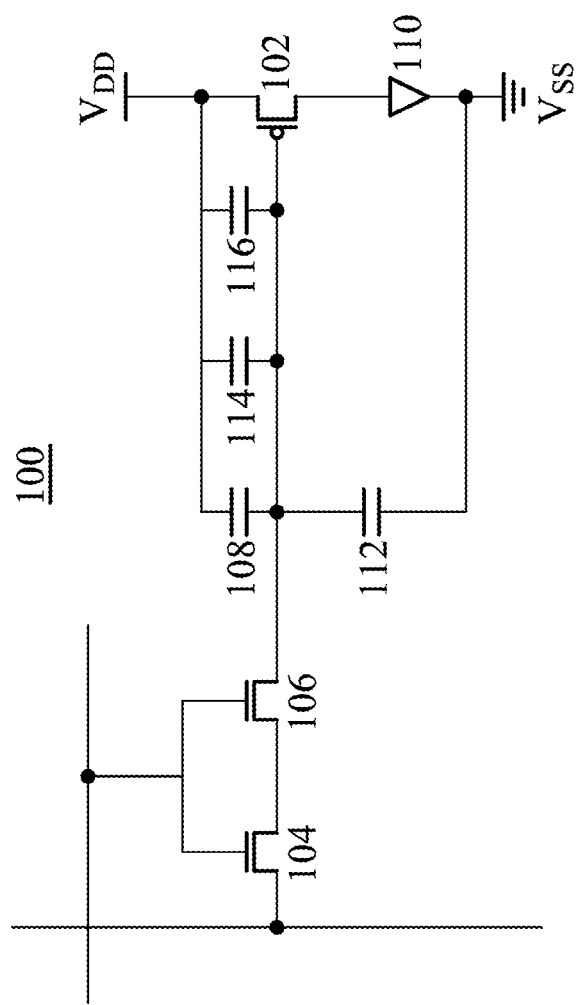
FIG. 10 is a circuit diagram of a pixel of an electroluminescence device consistent with embodiments of the present invention.
Figure 11:
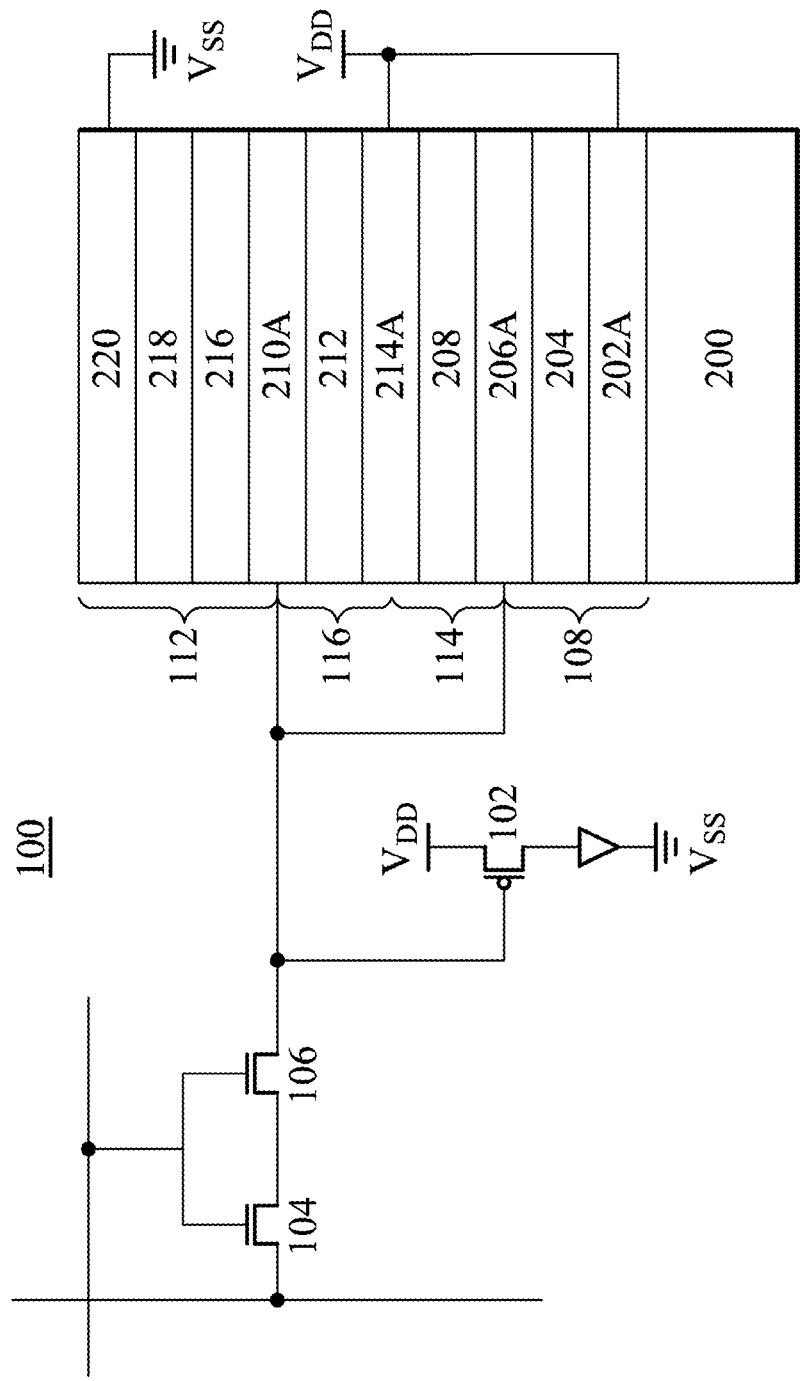
FIG. 11 is a circuit diagram of the pixel of FIG. 10, further showing a cross-sectional view of a part of the pixel and consistent with embodiments of the present invention.

Also consistent with embodiments of the present invention, more than two capacitors may be formed over the same area (area A) of substrate 200 and connected in parallel with one another. An example of four capacitors is shown in FIGS. 10 and 11, wherein FIG. 10 is a circuit schematic of pixel 100 with four capacitors and FIG. 11 further shows a cross-sectional view of those four capacitors formed over area A of substrate 200. As shown in FIG. 10, in addition to capacitors 108 and 112, two more capacitors 114 and 116 are also coupled between the gate and source of transistor 102. The rest of the circuit diagram is the same as that shown in FIG. 1 and therefore is not further described here. Thus, a storage capacitance of pixel 100 is equal to the sum of capacitors 108, 112, 114, and 116. Referring to FIG. 11, capacitor 108 comprises a doped polysilicon pattern 202A, oxide 204, and first metal pattern 206A; capacitor 114 comprises first metal pattern 206A, ILD 208, and ITO pattern 214A; capacitor 116 comprises ITO pattern 214A, passivation silicon nitride 212, and second metal pattern 210A; and capacitor 112 comprises second metal pattern 210A, capping silicon nitride layer 216, organic 218, and third metal layer 220. Polysilicon pattern 202A and ITO pattern 214A are coupled to $V_{DD}$, first metal pattern 206A and second metal pattern 210A are coupled to the gate of transistor 102, i.e., first metal pattern 206B, and third metal 220 is coupled to $V_{SS}$.

One skilled in the art should appreciate that the formation of capacitors 108, 112, 114, and 116 does not require more masks in addition to those already existing for the formation of pixel 100. For example, doped polysilicon pattern 202A may be formed at the same time doped polysilicon pattern 202B is formed, first metal pattern 206A may be formed at the same time first metal pattern 206B is formed, and ITO pattern 214A may be formed at the same time ITO pattern 214C is formed. Additionally, since all of capacitors 108, 112, 114, and 116 are formed over area A of substrate 200, the area of the storage capacitor of pixel 100 is not increased and, therefore, an aperture ratio is not decreased, while the storage capacitance is significantly increased.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:
1. A method for forming a pixel of an electroluminescence device, comprising:
providing a substrate;
defining at least a first area for capacitors, a second area for a transistor on the substrate and a third area for an organic light-emitting diode (OLED) on the substrate;
forming a first conductive layer over the first area;
forming a first dielectric layer over the first conductive layer over the first area;

forming a second conductive layer over the first dielectric layer over the first area;
forming a second dielectric layer over the second conductive layer over the first area;
forming a third conductive layer over the second dielectric layer over the first area;
forming a semiconductor layer over the second area;
forming a gate oxide layer over the second area and over the first conductive layer over the first area, wherein forming the first dielectric layer comprises forming an interlayer dielectric over the gate oxide; and
forming a fourth conductive layer over the gate oxide layer over the second area;
forming a fifth conductive layer over the third area;
forming an organic layer over the fifth conductive layer over the third area, wherein forming the second dielectric layer comprises forming the organic layer over the second conductive layer, wherein the third conductive layer is over the organic layer over the third area;
wherein the first conductive layer over the first area is directly connected to a power supply voltage, wherein the second conductive layer is electrically connected to the fourth conductive layer and wherein the first conductive layer, the first dielectric layer, and the second conductive layer over the first area collectively form a first one of the capacitors over the first area, the second conductive layer, the second dielectric layer, and the third conductive layer over the first area collectively form a second one of the capacitors over the first area, and the semiconductor layer, the gate oxide layer, and the fourth conductive layer over the second area collectively form a transistor, and
wherein forming the first conductive layer and forming the semiconductor layer comprise forming the first conductive layer and the semiconductor layer using the same semiconductor material which is provided as doped polysilicon, and wherein the fifth conductive layer, the organic layer, and the third conductive layer over the third area collectively form the OLED.

2. The method of claim 1, further comprising forming the second conductive layer over the second area for providing contact to the semiconductor layer.

3. The method of claim 1, wherein forming the second conductive layer and forming the fifth conductive layer comprise forming the second conductive layer and the fifth conductive layer using the same material.

4. The method of claim 1, further comprising forming a third dielectric layer between the second conductive layer and the second dielectric layer, wherein the third dielectric layer comprises passivation silicon nitride or capping silicon nitride.

5. The method of claim 1, wherein forming the fifth conductive layer comprises forming a layer of indium tin oxide (ITO).

6. A method for forming a pixel of an electroluminescence device, comprising:
providing a substrate;
defining at least a first area for capacitors, a second area for a transistor on the substrate and a third area for an organic light-emitting diode (OLED) on the substrate;
forming a first conductive layer over the first area;
forming a first dielectric layer over the first conductive layer over the first area;
forming a second conductive layer over the first dielectric layer over the first area;
forming a second dielectric layer over the second conductive layer over the first area;
forming a third conductive layer over the second dielectric layer over the first area;
forming a layer of capping silicon nitride between the second dielectric layer and the third conductive layer over the first area;
forming a semiconductor layer over the second area;
forming a gate oxide layer over the first area and the second area, wherein the first conductive layer is both over the gate oxide over the first area and over the second area, the first conductive layer providing contact to the semiconductor layer over the second area;
forming a fourth conductive layer over the gate oxide layer over the second area;
forming a fifth conductive layer over the third area; and
forming an organic layer over the fifth conductive layer over the third area, wherein the third conductive layer over the organic layer over the third area,
wherein the first conductive layer over the first area is directly connected to a power supply voltage, wherein the second conductive layer is electrically connected to the fourth conductive layer and wherein the first conductive layer, the first dielectric layer, and the second conductive layer over the first area collectively form a first one of the capacitors over the first area, the second conductive layer, the second dielectric layer, and the third conductive layer over the first area collectively form a second one of the capacitors over the first area, and the semiconductor layer, the gate oxide layer, and the fourth conductive layer over the second area collectively form a transistor, and
wherein forming the first dielectric layer comprises forming a layer of passivation silicon nitride, forming the second conductive layer and forming the fifth conductive layer comprise forming the second conductive layer and the fifth conductive layer using the same material, and forming the second dielectric layer comprises forming a layer of capping silicon nitride, and wherein the fifth conductive layer, the organic layer, and the third conductive layer over the third area collectively form the OLED.

7. The method of claim 6, further comprising forming an interlayer dielectric layer over the gate oxide layer over the first area and forming the first conductive layer over the third dielectric layer.

8. The method of claim 6, further comprising forming the organic layer between the second dielectric and the third conductive layer over the first area.

* * * * *